(12) United States Patent
Lee et al.

(10) Patent No.: US 8,295,111 B2
(45) Date of Patent: Oct. 23, 2012

(54) SEMICONDUCTOR MEMORY DEVICE COMPRISING SENSING CIRCUITS WITH ADJACENT COLUMN SELECTORS

(75) Inventors: Jae-Young Lee, Hwaseong-si (KR); Jung-Hwa Lee, Suwon-si (KR); Bong-Jin Kang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 64 days.

(21) Appl. No.: 12/894,246

(22) Filed: Sep. 30, 2010

(65) Prior Publication Data

US 2011/0075499 A1 Mar. 31, 2011

(30) Foreign Application Priority Data

Sep. 30, 2009 (KR) .................. 10-2009-0093360
Sep. 30, 2009 (KR) .................. 10-2009-0093364

(51) Int. Cl.
*G11C 7/00* (2006.01)
(52) U.S. Cl. ............... 365/205; 365/63; 365/190
(58) Field of Classification Search ............. 365/205, 365/63, 190
See application file for complete search history.

(56) References Cited

U.S. PATENT DOCUMENTS

| 6,229,758 B1 * | 5/2001 | Agata .................. 365/189.05 |
| 2008/0298111 A1 * | 12/2008 | Ahn et al. .................. 365/51 |

FOREIGN PATENT DOCUMENTS

| JP | 2001266569 A | 9/2001 |
| KR | 100164825 B1 | 9/1998 |
| KR | 1020020037486 A | 5/2002 |

\* cited by examiner

*Primary Examiner* — Huan Hoang
(74) *Attorney, Agent, or Firm* — Volentine & Whitt, PLLC

(57) ABSTRACT

A semiconductor memory device comprises a substrate comprising a first cell array region, a first sense circuit region, a second sense circuit region, and a second cell array region that are arranged in order from a first side to a second side. First and second bit lines are coupled to a plurality of memory cells in the first cell array region, and first and second complementary bit lines are coupled to a plurality of memory cells in the second cell array region. A first column selector is formed in the first sense circuit region and is coupled to the first bit line and the first complementary bit line. A second column selector is formed in the second sense circuit region and is coupled to the second bit line and the second complementary bit line. The first column selector and the second column selector are formed directly adjacent to each other.

15 Claims, 9 Drawing Sheets

SEMICONDUCTOR MEMORY DEVICE COMPRISING SENSING CIRCUITS WITH ADJACENT COLUMN SELECTORS

CROSS-REFERENCE TO RELATED APPLICATIONS

This application claims priority under 35 U.S.C. §119 to Korean Patent Applications Nos. 10-2009-0093360 filed on Sep. 30, 2009, and 10-2009-0093364 filed on Sep. 30, 2009, the respective disclosures of which are hereby incorporated by reference in their entirety.

BACKGROUND

Embodiments of the inventive concept relate generally to semiconductor memory devices. More particularly, embodiments of the inventive concept relate to semiconductor memory devices having sensing circuits with particular layout structures.

Certain types of semiconductor memory devices, such as dynamic random access memories (DRAMs), have evolved based on a folded bit line structure. In the folded bit line structure, bit lines are routed through a memory cell array in complementary pairs, and memory cells are sensed through the complementary bit line pairs using a differential sense amplifier. This arrangement tends to eliminate common-mode noise that arises from a wordline coupled to both bit-lines. However, the folded bit line structure places limitations on the size of memory cells and other features in the semiconductor devices. To address these and other limitations, research into open bit line structures has recently been conducted to improve the integration density of semiconductor memory devices.

SUMMARY

Embodiments of the inventive concept provide semiconductor memory devices comprising sensing circuits with particular layout structures. Certain embodiments use an open bit line structure with different sense circuits having adjacent column selectors. Some of these embodiments have improved sensitivity compared to conventional semiconductor memory devices.

According to one embodiment of the inventive concept, a semiconductor memory device comprises a substrate comprising a first cell array region, a first sense circuit region, a second sense circuit region, and a second cell array region that are formed in order from a first side to a second side. The device further comprises first and second bit lines coupled to a plurality of memory cells formed in the first cell array region, and first and second complementary bit lines coupled to a plurality of memory cells formed in the second cell array region, wherein the first and second complementary bit lines are complementary to the respective first and second bit lines. The device further comprises a first column selector formed in the first sense circuit region and coupled to the first bit line and the first complementary bit line, and a second column selector formed in the second sense circuit region and coupled to the second bit line and the second complementary bit line. The first column selector and the second column selector are formed directly adjacent to each other.

In certain embodiments, the first complementary bit line traverses the second sense circuit region and extends to the first sense circuit region, and the second bit line traverses the first sense circuit region and extends to the second sense circuit region.

In certain embodiments, the semiconductor memory device further comprises a first sense amplifier of a first conductivity type and a second sense amplifier of a second conductivity type that are formed in the first sense circuit region, and a third sense amplifier of the second conductivity type and a fourth sense amplifier of the first conductivity type that are formed in the second sense circuit region.

In certain embodiments, the first column selector comprises a first column selection transistor coupled between the first bit line and a first input/output line and a second column selection transistor coupled between the first complementary bit line and a first complementary input/output line, the first sense amplifier of the first conductivity type comprises a first sensing transistor coupled to the first bit line and a second sensing transistor coupled to the first complementary bit line, and a distance between the first column selection transistor and the first sensing transistor is substantially the same as a distance between the second column selection transistor and the second sensing transistor.

In certain embodiments, a first sense amplifier of a first conductivity type, a first equalizer, a second sense amplifier of a second conductivity type, and the first column selector are positioned in the first sense circuit region in order from the first side to the second side, and the second column selector, a third sense amplifier of the second conductivity type, a second equalizer, and a fourth sense amplifier of the first conductivity type are positioned in the second sense circuit region in order from the first side to the second side.

In certain embodiments, a first sense amplifier of a first conductivity type, a second sense amplifier of a second conductivity type, a first equalizer, and the first column selector are positioned in the first sense circuit region in order from the first side to the second side, and the second column selector, a second equalizer, a third sense amplifier of the second conductivity type, and a fourth sense amplifier of the first conductivity type are positioned in the second sense circuit region in order from the first side to the second side.

In certain embodiments, a first equalizer, a first sense amplifier of a first conductivity type, a second sense amplifier of a second conductivity type, and the first column selector are positioned in the first sense circuit region in order from the first side to the second side, and the second column selector, a third sense amplifier of the second conductivity type, a fourth sense amplifier of the first conductivity type, and a second equalizer are positioned in the second sense circuit region in order from the first side to the second side.

In certain embodiments, the first conductivity type is P-type and the second conductivity type is N-type.

According to another embodiment of the inventive concept, a semiconductor memory device comprises a first bit line and a first complementary bit line formed with an open bit line structure, a second bit line and a second complementary bit line formed with an open bit line structure, and a first sense amplifier of a first conductivity type, a first equalizer, a second sense amplifier of a second conductivity type, a first column selector, a second column selector, a third sense amplifier of the second conductivity type, a second equalizer, and a fourth sense amplifier of the first conductivity type that are positioned in order from a first side to a second side. The first sense amplifier of the first conductivity type, the first equalizer, the second sense amplifier of the second conductivity type, and the first column selector are connected to the first bit line and the first complementary bit line. The second column selector, the third sense amplifier of the second conductivity type, the second equalizer, and the fourth sense amplifier of the first conductivity type are connected to the second bit line and the second complementary bit line.

In certain embodiments, the first conductivity type is P-type and the second conductivity type is N-type.

In certain embodiments, the semiconductor memory device further comprises a first memory cell array connected to the first and second bit lines, and a second memory cell array connected to the first and second complementary bit lines.

According to still another embodiment of the inventive concept, a semiconductor memory device comprises a substrate comprising a first cell array region, a first sense circuit region, a second sense circuit region, and a second cell array region arranged in order from a first side to a second side, first and second bit lines coupled to a plurality of memory cells formed in the first cell array region, first and second complementary bit lines coupled to a plurality of memory cells formed in the second cell array region, wherein the first and second complementary bit lines are complementary to the respective first and second bit lines, and a P-type first sense amplifier, a first equalizer, an N-type second sense amplifier, and a first column selector that are formed in the first sense circuit region and are coupled to the first bit line and the first complementary bit line, wherein the P-type first sense amplifier and the N-type second sense amplifier are positioned on opposite sides of the first equalizer.

In certain embodiments, the semiconductor memory device further comprises a second column selector coupled to the second bit line and the second complementary bit line, an N-type third sense amplifier, a second equalizer, and a P-type fourth sense amplifier that are formed in the second sense circuit region, wherein the P-type fourth sense amplifier and the N-type third sense amplifier are formed on opposite sides of the second equalizer.

In certain embodiments, the P-type first sense amplifier, the first equalizer, the N-type second sense amplifier, and the first column selector are positioned in the first sense circuit region in order from the first side to the second side, and the second column selector, the N-type third sense amplifier, the second equalizer, and the P-type fourth sense amplifier are positioned in the second sense circuit region in order from the first side to the second side.

In certain embodiments, the P-type first sense amplifier, the first equalizer, the first column selector, and the N-type second sense amplifier are positioned in the first sense circuit region in order from the first side to the second side, and the second column selector, the N-type third sense amplifier, the second equalizer, and the P-type fourth sense amplifier are positioned in the second sense circuit region in order from the first side to the second side.

In certain embodiments, the first column selector, the N-type second sense amplifier, the first equalizer, and the P-type first sense amplifier are positioned in the first sense circuit region in the order from the first side to the second side, and the P-type fourth sense amplifier, the second equalizer, the N-type third sense amplifier, and the second column selector are positioned in the second sense circuit region in order from the first side to the second side.

In certain embodiments, the P-type first sense amplifier and the P-type fourth sense amplifier are formed in the same well.

In certain embodiments, the N-type second sense amplifier, the first column selector, the first equalizer, and the P-type first sense amplifier are positioned in the first sense circuit region in order from the first side to the second side, and the P-type fourth sense amplifier, the second equalizer, the second column selector, and the N-type third sense amplifier are positioned in the second sense circuit region in order from the first side to the second side.

In certain embodiments, the P-type first sense amplifier and the P-type fourth sense amplifier are formed in the same well.

In certain embodiments, the first complementary bit line traverses the second sense circuit region and extends to the first sense circuit region, and the second bit line traverses the first sense circuit region and extends to the second sense circuit region.

BRIEF DESCRIPTION OF THE DRAWINGS

The drawings illustrate selected embodiments of the inventive concept. In the drawings, like reference numbers denote like features. In addition, the dimensions and relative dimensions of certain features may be exaggerated for clarity of illustration.

DETAILED DESCRIPTION OF THE EMBODIMENTS

Figure 1:
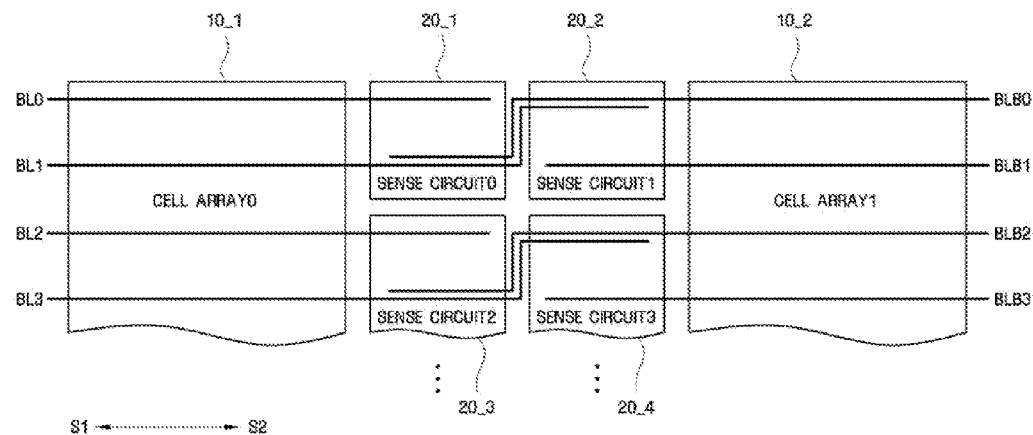
FIG. 1 is a sectional view illustrating a semiconductor device according to an embodiment of the inventive concept.

Embodiments of the inventive concept are described below with reference to the corresponding drawings. These embodiments are presented as teaching examples and should not be construed to limit the scope of the inventive concept.

It will be understood that when an element or layer is referred to as being "on" or "connected to" another element or layer, it can be directly on or connected to the other element or layer or intervening elements or layers may be present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Some embodiments or features of the embodiments are shown in the drawings in an abstract or idealized form. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing.

FIG. 1 is a sectional view illustrating a semiconductor device according to an embodiment of the inventive concept.

Referring to FIG. 1, a semiconductor memory device comprises first and second memory cell arrays 10_1 and 10_2 and first through fourth sense circuits 20_1 through 20_4. Although four sense-circuit regions are shown in FIG. 1, the semiconductor memory device may further include four or more sense-circuit regions.

The semiconductor memory device has an open bit line structure. Accordingly, as shown in FIG. 1, bit lines BL0 through BL3 and complementary bit lines BLB0 through BLB3 are positioned in different memory cell arrays. In particular, bit lines BL0 through BL3 are coupled to a plurality of memory cells (not shown) positioned in a first memory cell array 10_1, and complementary bit lines BLB0 through BLB3 are coupled to a plurality of memory cells (not shown) positioned in a second memory cell array 10_2.

As shown in FIG. 1, bit line BL1 extends across first sense circuit 20_1 to second sense circuit 20_2, and bit line BL3 extends across third sense circuit 20_3 to fourth sense circuit 20_4. Complementary bit line BLB2 extends across fourth sense circuit 20_4 to third sense circuit 20_3. First through fourth sense circuit 20_1 through 20_4 are circuits for sensing data stored in a plurality of memory cells positioned in first cell array 10_1 and second memory cell array 10_2. To this end, each of sense circuits 20_1 through 20_4 typically comprises a P-type sense amplifier, an N-type sense amplifier, an equalizer, and a column selector.

First sense circuit 20_1 is coupled to bit line BL0 and complementary bit line BLB0 to sense data stored in a memory cell coupled to bit line BL0 or complementary bit line BLB0. Second sense circuit 20_2 is coupled to bit line BL1 and complementary bit line BLB1 to sense data stored in a memory cell coupled to bit line BL1 or complementary bit line BLB1. Third sense circuit 20_3 is coupled to bit line BL2 and complementary bit line BLB2 to sense data stored in a memory cell coupled to bit line BL2 or complementary bit line BLB2. Fourth sense circuit 20_4 is coupled to bit line BL3 and complementary bit line BLB3 to sense data stored in a memory cell coupled to bit line BL3 or complementary bit line BLB3.

Where first memory cell array 10_1 is positioned at a first side, e.g., a left side S1, and second memory cell array 10_2 is positioned at a second side, e.g., a right side S2, first through fourth sense circuits 20_1 through 20_4 are positioned between first memory cell array 10_1 and the second memory cell array 10_2, in which first and third sense circuits 20_1 and 20_3 are positioned at first side S1 and second and fourth sense circuits 20_2 and 20_4 are positioned at second side S2, respectively. More specifically, second sense circuit 20_2 is positioned at second side S2 of first sense circuit 20_1, third sense circuit 20_3 is positioned under first sense circuit 20_1, and fourth sense circuit 20_4 is positioned at second side S2 of third sense circuit 20_3. This structure can be referred to as an alternated bit line sense amplifier (BLSA) structure.

In a conventional folded bit line structure, as the size of a memory cell decreases, the pitch between bit lines, e.g., BL0 and BLB0, decreases as well. In the conventional folded bit line structure, a sense circuit is considerably large relative to a small-sized memory cell, which makes it difficult to implement a reduced pitch between bit lines, e.g., BL0 and BLB0, in the sense circuit. However, in an alternated BLSA structure, sense circuits, e.g., 20_1 and 20_2, are positioned in regions corresponding to two bit lines, e.g., BL0 and BL1. Accordingly, first sense circuit 20_1 and second sense circuit 20_2 are horizontally adjacent to each other. Therefore, the alternated BLSA structure can be used to form sense circuits in a larger area than in the folded bit line structure, which is advantageous in achieving a highly integrated and high-performance semiconductor memory device.

Hereinafter, selected layouts of sense circuits used in the semiconductor memory device of FIG. 1 will be described with reference to FIGS. 2 and 3 through 7C. Various alternative layouts are then described with reference to FIGS. 8 through 12. For brevity of explanation, the description will focus on sense circuits 20_1 and 20_2, but the layouts of sense circuits 20_3 and 20_4 can be inferred from the layouts of sense circuits 20_1 and 20_2.

Figure 2:
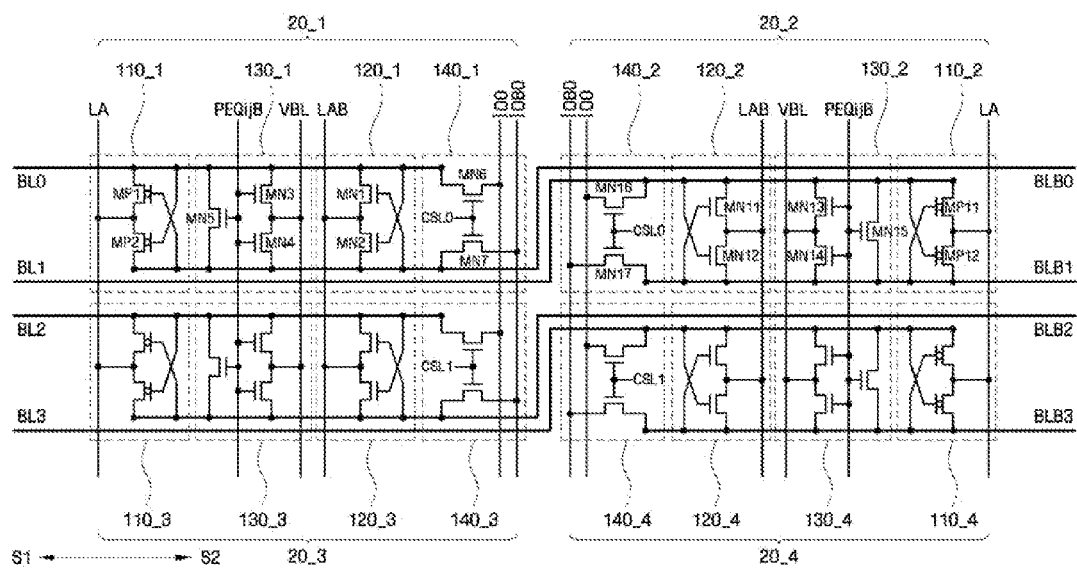
FIG. 2 is a circuit diagram illustrating one example configuration of sense circuits shown in FIG. 1.

FIG. 2 is a circuit diagram illustrating one example configuration of sense circuits 20_1 through 20_4 of FIG. 1.

Referring to FIG. 2, sense circuits 20_1 through 20_4 comprise P-type sense amplifiers 110_1 through 110_4, N-type sense amplifiers 120_1 through 120_4, equalizers 130_1 through 130_4, and column selectors 140_1 through 140_4.

Bit line sense amplifiers are formed by P-type sense amplifiers 110_1 through 110_4 and N-type sense amplifiers 120_1 through 120_4. These bit line sense amplifiers amplify voltage differences between bit lines BL0 through BL3 and complementary bit lines BLB0 through BLB3.

P-type sense amplifier 110_1 comprises a sensing transistor MP1 of a first conductivity type (e.g., P type) that is coupled between bit line BL0 and a voltage line LA and is turned on according to a voltage level of complementary bit line BLB0, and a sensing transistor MP2 of the first conductivity type that is coupled between complementary bit line BLB0 and voltage line LA and is turned on according to a voltage level of bit line BL0.

N-type sense amplifier 120_1 comprises a sensing transistor MN1 of a second conductivity type (e.g., N type) that is coupled between bit line BL0 and a voltage line LAB and is turned on according to a voltage level of complementary bit line BLB0, and a sensing transistor MN2 of the second conductivity type that is coupled between complementary bit line BLB0 and voltage line LAB and is turned on according to a voltage level of bit line BL0. Similarly, P-type sense amplifier 110_2 comprises sensing transistors MP11 and MP12 of the first conductivity type, and N-type sense amplifier 120_2 comprises sensing transistors MN11 and MN12 of the second conductivity type.

Equalizers 130_1 through 130_4 pre-charge bit lines BL0 through BL3 and complementary bit lines BLB0 through BLB3 to a predetermined voltage level.

Equalizer 130_1 comprises an equalizing transistor MN3 of a second conductivity type (e.g., an N type) coupled between bit line BL0 and a voltage line VBL, an equalizing transistor MN4 of the second conductivity type coupled between complementary bit line BLB0 and voltage line VBL, and an equalizing transistor MN5 of the second conductivity type coupled between bit line BL0 and complementary bit line BLB0. Equalizing transistors MN3, MN4, and MN5 all are turned on in response to an equalizing signal PEQijB. Similarly, equalizer 130_2 comprises equalizing transistors MN13, MN14, and MN15 of the second conductivity type.

Column selectors 140_1 through 140_4 selectively couple bit lines BL0 through BL3 and complementary bit lines BLB0 through BLB3 with input/output lines IO0 and IO1 and complementary input/output lines IOB0 and IOB1.

Column selector 140_1 comprises a column selection transistor MN6 of a second conductivity type (e.g., an N type) coupled between bit line BL0 and input/output line 100 and a column selection transistor MN7 of the second conductivity type coupled between complementary bit line BLB0 and the input/output line IOB0. Similarly, column selector 140_2 comprises column selection transistors MN16 and MN17 of the second conductivity type.

Here, column selectors 140_1 and 140_2 positioned at first side S1 and second side S2 are provided with the same column selection signal CSL0. Accordingly, sense circuit 20_1 and sense circuit 20_2 operate and output data at the same time.

Figure 3:
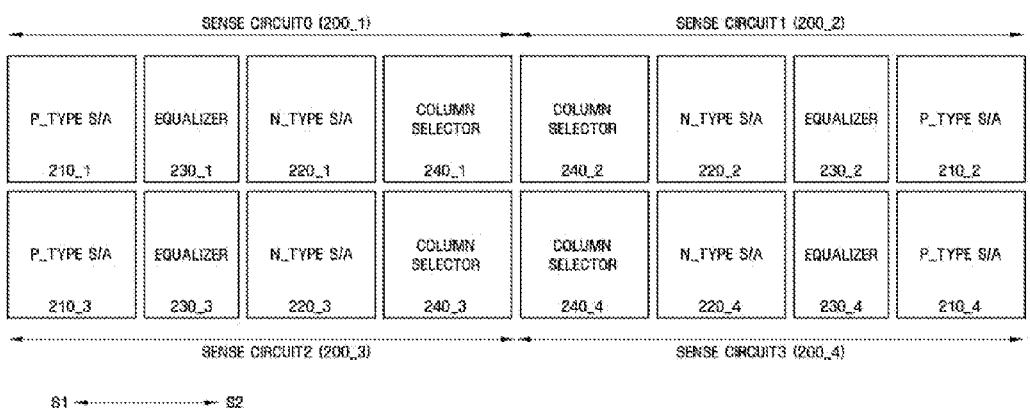
FIG. 3 is a conceptual layout diagram for explaining the sense circuits of FIG. 2.
Figure 4A:
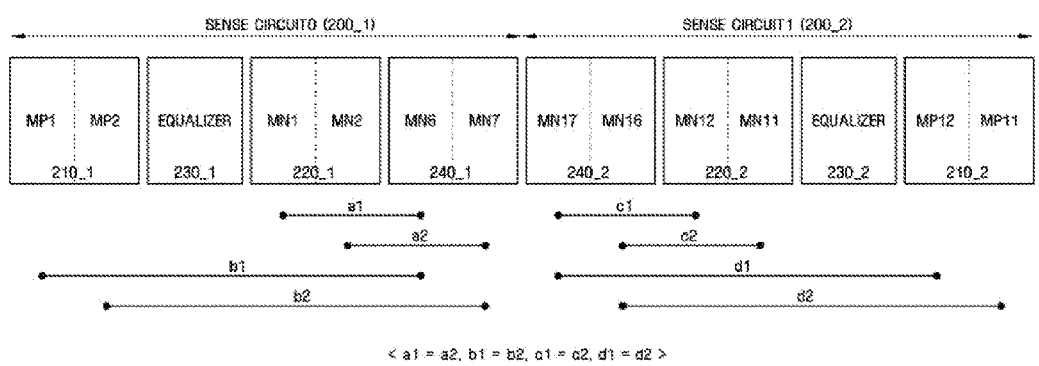
FIGS. 4A and 4B are diagrams for explaining various effects of the sense circuits of FIG. 3.
Figure 4B:
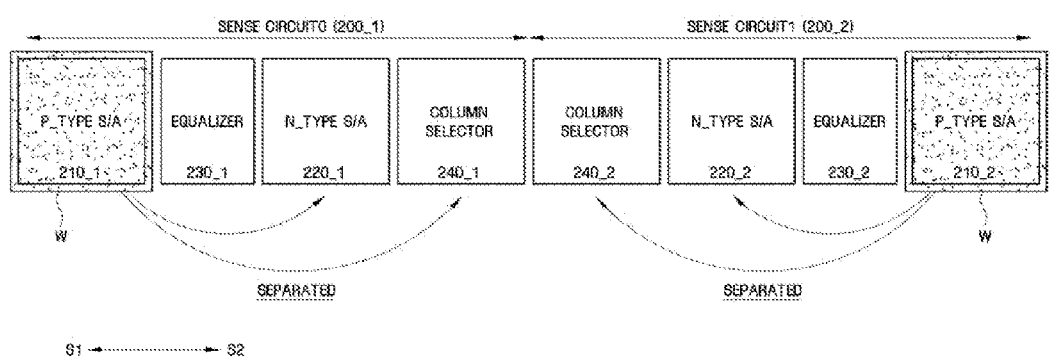

FIG. 3 is a conceptual layout diagram for explaining the sense circuits of FIG. 2. FIGS. 4A and 4B are diagrams for explaining various effects of the sense circuits of FIG. 3.

Referring to FIGS. 2 and 3, first and second memory cell array regions and first through fourth sense circuit regions 200_1 through 200_4 are defined on a substrate. The first and second memory cell array regions correspond to memory cell arrays 10_1 and 10_2 of FIG. 1, and first through fourth sense circuit regions 200_1 through 200_4 correspond to sense circuits 20_1 through 20_4 of FIG. 1.

Sense circuit regions 200_1 through 200_4 comprise P-type sense amplifier regions 210_1 through 210_4, N-type sense amplifier regions 220_1 through 220_4, equalizer regions 230_1 through 230_4, and column selector regions 240_1 through 240_4.

P-type first sense amplifier 110_1, first equalizer 130_1, N-type second sense amplifier 120_1, and first column selector 140_1 are positioned in first sense circuit region 200_1 in order from first side S1 to second side S2. In addition, second column selector 140_2, N-type third sense amplifier 120_2, second equalizer 130_2, and P-type fourth sense amplifier 110_2 are positioned in second sense circuit region 200_2 in order from first side S1 to second side S2.

Regions 210_1 through 210_4, 220_1 through 220_4, 230_1 through 230_4, and 240_1 through 240_4, as referred to in FIG. 3, are labeled to indicate mean regions where corresponding functional blocks are formed, but do not refer to physically separated active regions where the functional blocks are formed. In other words, regions 210_1 through 210_4, 220_1 through 220_4, 230_1 through 230_4, and 240_1 through 240_4 indicated in FIG. 3 are not physically isolated from each other but rather they correspond to functionally grouped or functionally separate elements. As indicated, for instance, in FIGS. 7A through 7C, different functional blocks can be formed in the same active region or in different active regions.

Because column selector regions 240_1 and 240_2 are positioned in a center of sense circuit regions 200_1 and 200_2, first column selector 140_1 and second column selector 140_2 are positioned in the center of sense circuit regions 200_1 and 200_2. First column selector 140_1 is biased to second side S2 in first sense circuit region 200_1, and second column selector 140_2 is biased to first side S1 in second sense circuit region 200_2. More specifically, first column selector 140_1 is formed in first sense circuit region 200_1, second column selector 140_2 is formed in second sense circuit region 200_2, and first column selector 140_1 and the second column selector 140_2 are formed directly adjacent to each other. Because first column selector 140_1 and second column selector 140_2 are formed directly adjacent to each other, a circuit such as a P-type sense amplifier, an N-type sense amplifier, or an equalizer are not positioned between first column selector 140_1 and the second column selector 140_2.

By forming first column selector 140_1 and second column selector 140_2 directly adjacent to each other at the center of sense circuit regions 200_1 and 200_2, it is possible to reduce a line loading mismatch that may occur between column selector (e.g., 140_1) and a sense amplifier (e.g., 120_1). By reducing the line loading mismatch, the sensitivity of sense circuits 20_1 through 20_4 can be improved.

As illustrated, for instance, by FIG. 4, column selection transistors MN6 and MN7 of first column selector 140_1 can be formed in the first column selector region 240_1, sensing transistors MP1 and MP2 of the P-type first sense amplifier 110_1 can be formed in the P-type sense amplifier region 210_1, and sensing transistors MN1 and MN2 of N-type second sense amplifier 120_1 can be formed in N-type sense amplifier region 220_1.

A distance "a1" between column selection transistor MN6 and sensing transistor MN1 is substantially the same as a distance "a2" between column selection transistor MN7 and sensing transistor MN2. Consequently, a length of bit line BL from P-type first sense amplifier 110_1 to first column selector 140_1 can be substantially the same as a length of complementary bit line BLB0 from P-type first sense amplifier 110_1 to first column selector 140_1. Accordingly, bit-line loading mismatch of these bitlines can be reduced.

A distance "b1" between column selection transistor MN6 and sensing transistor MP1 is substantially the same as a distance "b2" between column selection transistor MN7 and sensing transistor MP2. Consequently, a length of bit line BL from N-type second sense amplifier 120_1 to first column selector 140_1 is substantially the same as a length of complementary bit line BLB0 from N-type second sense amplifier 120_1 to first column selector 140_1. Accordingly, bit-line loading mismatch of these bitlines can be reduced.

Likewise, column selection transistors MN16 and MN17 of second column selector 140_2 can be formed in a second column selector region 240_2, sensing transistors MP11 and MP12 of the P-type fourth sense amplifier 110_2 can be formed in a P-type sense amplifier region 210_2, sensing transistors MN11 and MN12 of N-type third sense amplifier 120_2 can be formed in N-type sense amplifier region 220_1. A distance "c2" between column selection transistor MN16 and sensing transistor MN11 is substantially the same as a distance "c1" between column selection transistor MN17 and sensing transistor MN12. A distance "d2" between column selection transistor MN16 and sensing transistor MP11 is substantially the same as a distance "d1" between column selection transistor MN17 and sensing transistor MP12.

As shown in FIG. 3, P-type sense amplifier region 210_1 is positioned at any one (e.g., first side S1) of first side S1 and second side S2 of an equalizer region (e.g., 230_1), and N-type sense amplifier region 220_1 and column selector region 240_1 are positioned at the other side (e.g., second side S2). Accordingly, P-type first sense amplifier 110_1 is positioned at any one (e.g., first side S1) of first side S1 and second side S2 of equalizer 130_1, and N-type second sense amplifier 120_1 and first column selector 140_1 are positioned at the other side (e.g., second side S2).

P-type first sense amplifier 110_1 is formed in an N-type well "W". N-type well "W" is formed by using implant processing. By the nature of implant processing, a small amount of N-type impurities are injected into a region in vicinity of an implant target region. As a result, a circuit block formed in vicinity of P-type first sense amplifier 110_1 is affected by the N-type impurities, which is called a well proximity effect (WPE). For example, where circuit blocks forming a transistor pair such as the N-type second sense amplifier 120_1 and first column selector 140_1 are positioned in vicinity of the N-type well "W", threshold voltages Vth of the transistors of the pair may be different from each other. In this situation, the WPE is one of the factors causing deterioration in sensing sensitivity.

In the layout of FIGS. 2 through 7, P-type first sense amplifier 110_1 is separated from N-type second sense amplifier 120_1 and first column selector 140_1. As a result, N-type second sense amplifier 120_1 and first column selector 140_1 are not affected by an N-type well "W". Consequently, threshold voltages of the sensing transistors MN1 and MN2 of the N-type second sense amplifier 120_1 can be substantially the same as each other. Likewise, threshold voltages of column selection transistors MN6 and MN7 of N-type second sense amplifier 120_1 can also be substantially the same as each other.

P-type fourth sense amplifier 110_2 is also separated from N-type third sense amplifier 120_2 and second column selector 140_2, and thus N-type third sense amplifier 120_2 and second column selector 140_2 are not compromised by an N-type well "W".

Figure 5:
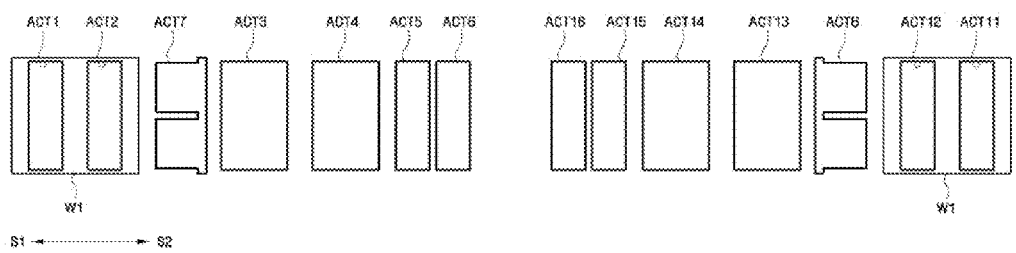
FIG. 5 illustrates active regions and wells in the sense circuits of FIG. 2.
Figure 6:
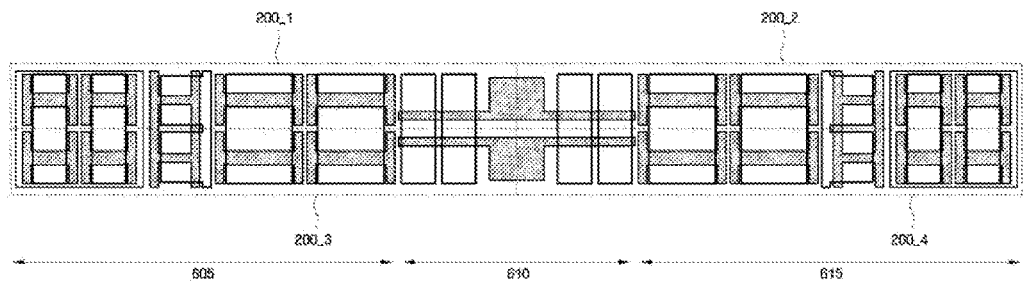
FIG. 6 illustrates active regions, wells, and gates in the sense circuits of FIG. 2.
Figure 7A:
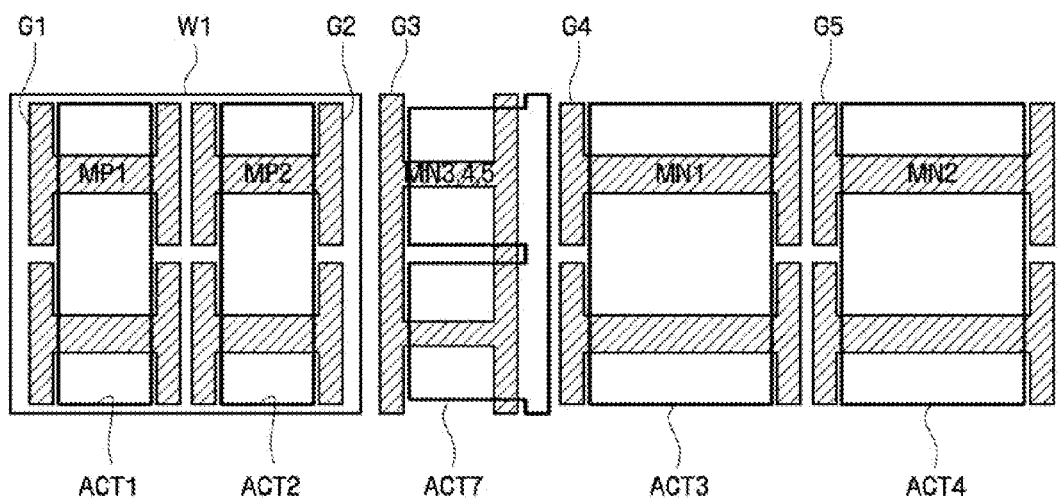
FIGS. 7A through 7C illustrate portions of FIG. 6.
Figure 7B:
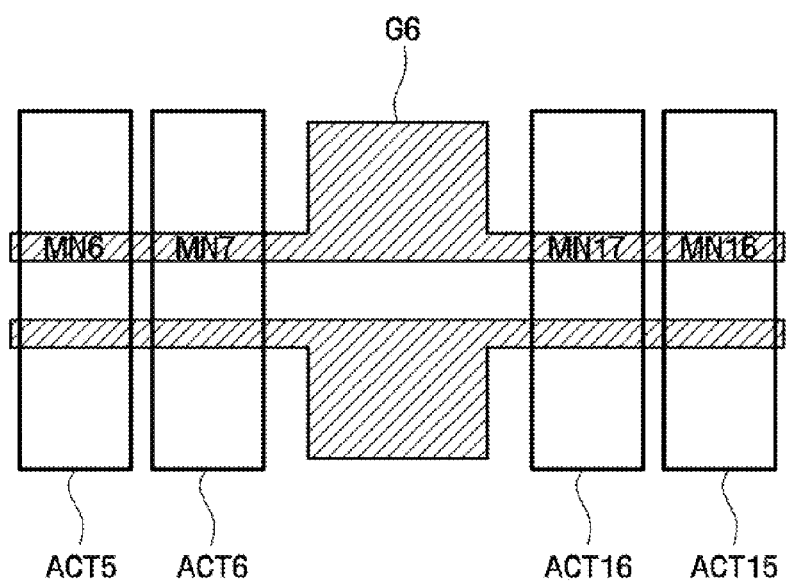
Figure 7C:
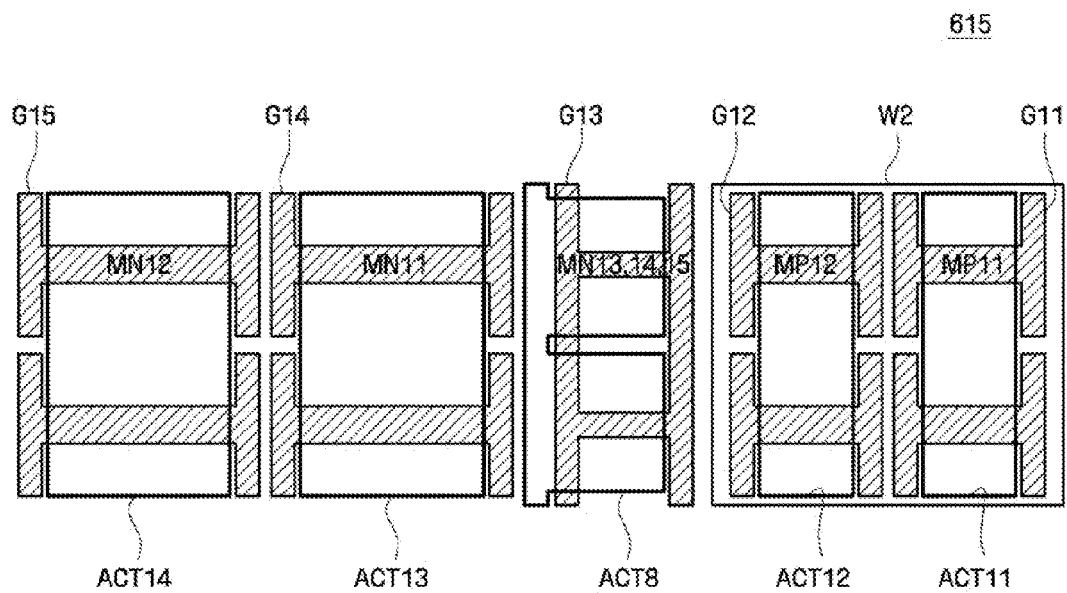

FIG. 5 illustrates active regions and wells in the sense circuits of FIG. 2, and FIG. 6 illustrates active regions, wells, and gates in the sense circuits of FIG. 2. FIGS. 7A through 7C illustrate portions of FIG. 6 for convenience of explanation.

Referring to FIG. 5, first through seventh active regions ACT1 through ACT7 and eleventh through seventeenth active regions ACT11 through ACT17 are defined in a substrate of a first conductivity type (e.g., a P type). First and second active regions ACT1 and ATC2 are formed in a well W1 of a second conductivity type (e.g., an N type), and eleventh and twelfth active regions ACT11 and ACT12 are formed in a well W2 of the second conductivity type.

In the example of FIG. 5, first through seventh active regions ACT1 through ACT7 and eleventh through seventeenth active regions ACT11 through ACT17 are formed symmetrical with each other. The inventive concept is not, however, limited to a symmetrical form.

In the embodiments of FIGS. 2 through 7, first through fourth sense circuit regions 200_1 through 200_4 can be separated as shown in FIG. 6.

Referring to FIG. 6, a plurality of sensing transistors is formed in each of the first through fourth active regions ACT1 through ACT4. More specifically, sensing transistors MP1 and MP2 of the first conductivity type are formed in first and second active regions ACT1 and ACT2, forming P-type first sense amplifier 110_1. Sensing transistors MN1 and MN2 of the second conductivity type are formed in third and fourth active regions ACT3 and ACT4, forming N-type second sense amplifier 120_1.

A plurality of sensing transistors is also formed in each of eleventh through fourteenth active regions ACT11 through ACT14. More specifically, sensing transistors MP11 and MP12 of the first conductivity type are formed in eleventh and twelfth active regions ACT11 and ACT12, forming P-type fourth sense amplifier 110_2. Sensing transistors MN11 and MN12 of the second conductivity type are formed in thirteenth and fourteenth active regions ACT13 and ACT14, forming N-type third sense amplifier 120_2.

Although FIG. 6 shows a gap between active regions ACT1 through ACT4 and active regions ACT11 through ACT14, these regions could be located closer together. In addition, although FIG. 6 shows gates G1 G2, G4, G5, G11 G12, G14, and G15 of sensing transistors MP1, MP2, MN1, MN2, MP11, MP12, MN11, and MN12 in the shape of an 'H', these elements could be formed with different shapes.

Column selection transistors MN6 and MN7 are formed in fifth and sixth active regions ACT5 and ACT6, forming first column selector 140_1. Column selection transistors MN16 and MN17 are formed in fifteenth and sixteenth active regions ACT15 and ACT16, forming second column selector 140_2. As illustrated, for instance, in FIG. 7B, column selection transistors MN6, MN7, MN16, and MN17 can be formed such that a gate, e.g., G6, traverses fifth and sixth active regions ACT5 and ACT6 and fifteenth and sixteenth active regions ACT15 and ACT16. Since column selection transistors MN6, MN7, MN16, and MN17 are coupled by a single gate G6, a layout size of the sensing circuits can be reduced.

Equalizing transistors MN3 through MN5, which form first equalizer 130_1, are formed in seventh active region ACT7, and equalizing transistors MN13 through MN15, which form second equalizer 130_2, are formed in seventeenth active region ACT17. Although FIG. 7C shows gates G3 and G13 of equalizing transistors MN3 through MN5 and equalizing transistors MN13 through MN15 in the shape of 'H', these features can be formed with other shapes.

Figure 8:
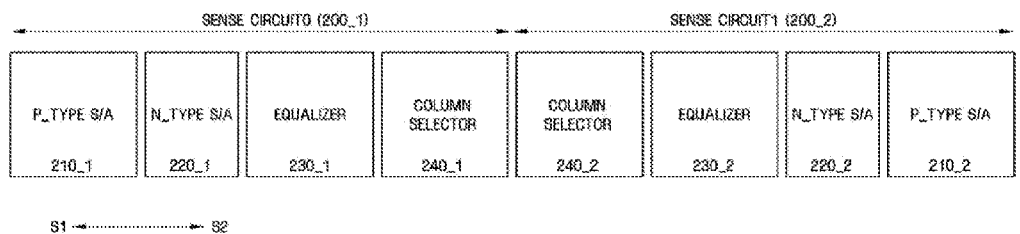
FIG. 8 is a conceptual layout diagram illustrating an alternative configuration of the sense circuits of FIG. 1.

FIG. 8 is a conceptual layout diagram illustrating an alternative configuration of sense circuits 20_1 through 20_4 of FIG. 1.

The configuration of FIG. 8 differs from that of FIGS. 2 and 3 due to a rearrangement of equalizer regions 230_1 through 230_4 and the N-type sense amplifier regions 220_1 and 220_2. In the configuration of FIG. 8, P-type first sense amplifier 110_1, N-type second sense amplifier 120_1, first equalizer 130_1, and first column selector 140_1 are positioned in first sense circuit region 200_1 in order from first side S1 to second side S2. Second column selector 140_2, second equalizer 130_2, N-type third sense amplifier 120_2, and P-type fourth sense amplifier 110_2 are positioned in second sense circuit region 200_2 in order from first side S1 to second side S2.

In the configuration of FIG. 8, because first column selector 240_1 and second column selector 240_2 are formed adjacent to each other, line loading mismatch can be reduced.

Figure 9:
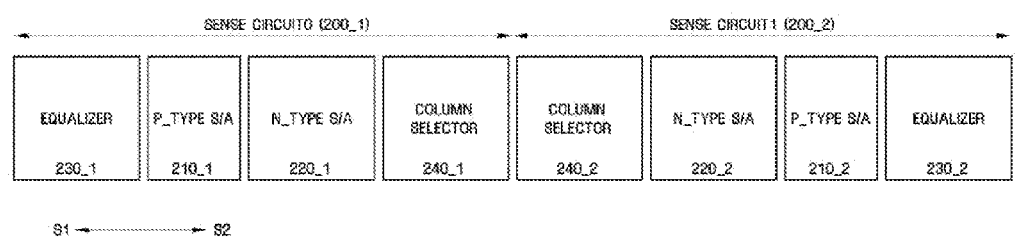
FIG. 9 is a conceptual layout diagram illustrating another alternative configuration of the sense circuits of FIG. 1.

FIG. 9 is a conceptual layout diagram illustrating another alternative configuration of sense circuits 20_1 through 20_4 of FIG. 1.

The configuration of FIG. 9 differs from that of FIGS. 2 and 3 due to a rearrangement of equalizer regions equalizer regions 230_1 and 230_2 and P-type sense amplifier regions 210_1 and 210_2. In the configuration of FIG. 9, first equalizer 130_1, P-type first sense amplifier 110_1, N-type second sense amplifier 120_1, and first column selector 140_1 are positioned in first sense circuit region 200_1 in the order from first side S1 to second side S2. Second column selector 140_2, N-type third sense amplifier 120_2, P-type fourth sense amplifier 110_2, and second equalizer 130_2 are positioned in second sense circuit region 200_2 in order from first side S1 to second side S2.

In the configuration of FIG. 9, because first column selector 240_1 and second column selector 240_2 are formed adjacent to each other, line loading mismatch can be reduced.

Figure 10:
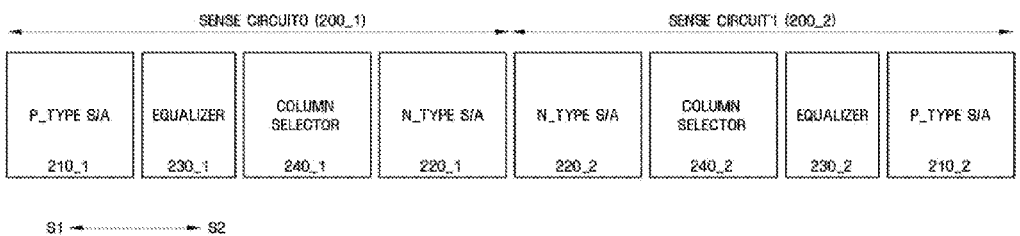
FIG. 10 is a conceptual layout diagram illustrating yet another alternative configuration of the sense circuits of FIG. 1.

FIG. 10 is a conceptual layout diagram illustrating yet another alternative configuration of sense circuits 20_1 through 20_4 of FIG. 1.

The configuration of FIG. 10 differs from that of FIGS. 2 and 3 due to a rearrangement of N-type sense amplifier regions 220_1 and 220_2 and column selectors 240_1 and 240_2. In the configuration of FIG. 10, P-type first sense amplifier 110_1, first equalizer 130_1, first column selector 140_1, and N-type second sense amplifier 120_1 are positioned in first sense circuit region 200_1 in order from first side S1 to second side S2. N-type third sense amplifier 120_2, second column selector 140_2, second equalizer 130_2, and P-type fourth sense amplifier 110_2 are positioned in second sense circuit region 200_2 in order from first side S1 to second side S2.

In the configuration of FIG. 10, because P-type first sense amplifier 110_1 is separated from first column selector 140_1 and N-type second sense amplifier 120_1, and P-type fourth sense amplifier 110_2 is separated from second column selector 140_2 and N-type third sense amplifier 120_2, the WPE can be reduced.

Figure 11:
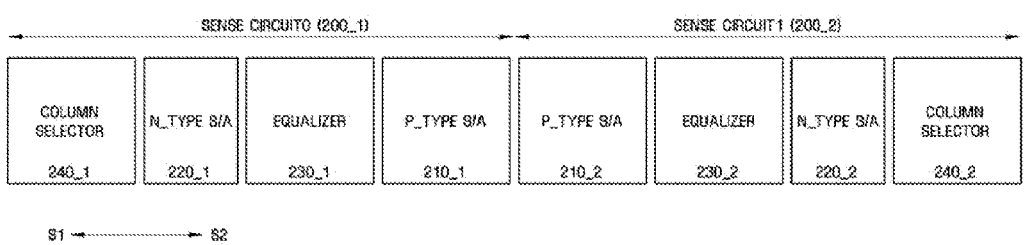
FIG. 11 is a conceptual layout diagram illustrating yet another alternative configuration of the sense circuits of FIG. 1.

FIG. 11 is a conceptual layout diagram illustrating yet another alternative configuration of sense circuits 20_1 through 20_4 of FIG. 1.

The configuration of FIG. 11 differs from that of FIGS. 2 and 3 due to a rearrangement of P-type sense amplifier regions 210_1 and 210_2. In particular, in FIG. 11, P-type sense amplifier regions 210_1 and 210_2 are positioned in the center of the sense circuit regions. Here, the P-type sense amplifier regions 210_1 and 210_2 are positioned adjacent to each other, such that the two P-type sense amplifiers 110_1 and 110_2 can be formed in the same well.

In the configuration of FIG. 11, first column selector 140_1, N-type second sense amplifier 120_1, first equalizer 130_1, and P-type first sense amplifier 110_1 are positioned in first sense circuit region 200_1 in order from first side S1 to second side S2. P-type fourth sense amplifier 110_2, second equalizer 130_2, N-type third sense amplifier 120_2, and second column selector 140_2 are positioned in second sense circuit region 200_2 in order from first side S1 to second side S2.

Since P-type first sense amplifier 110_1 is separated from first column selector 140_1 and N-type second sense amplifier 120_1, and P-type fourth sense amplifier 110_2 is separated from second column selector 140_2 and N-type third sense amplifier 120_2, the WPE can be reduced.

Figure 12:
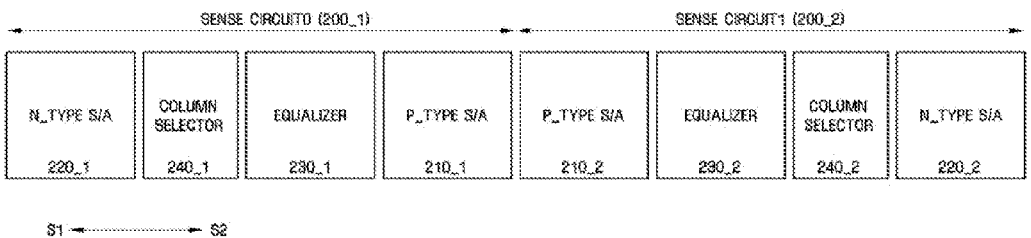
FIG. 12 is a conceptual layout diagram illustrating yet another alternative configuration of the sense circuits of FIG. 1.

FIG. 12 is a conceptual layout diagram illustrating yet another alternative configuration of sense circuits 20_1 through 20_4 of FIG. 1.

The configuration of FIG. 12 differs from that of FIGS. 2 and 3 due to a rearrangement of P-type sense amplifier regions 210_1 and 210_2. In particular, in FIG. 12, P-type sense amplifier regions 210_1 and 210_2 are positioned in the center of the sense circuit regions. P-type sense amplifier regions 210_1 and 210_2 are positioned adjacent to each other, such that the two P-type sense amplifiers 110_1 and 110_2 can be formed in the same well.

In the configuration of FIG. 12, N-type second sense amplifier 120_1, first column selector 140_1, first equalizer 130_1, and P-type first sense amplifier 110_1 are positioned in a first sense circuit region 200_1 in order from first side S1 to second side S2. P-type fourth sense amplifier 110_2, second equalizer 130_2, second column selector 140_2, and N-type third sense amplifier 120_2 are positioned in a second sense circuit region 200_2 in order from first side S1 to second side S2.

In the configuration of FIG. 12, because P-type first sense amplifier 110_1 is separated from first column selector 140_1 and N-type second sense amplifier 120_1, and P-type fourth sense amplifier 110_2 is separated from second column selector 140_2 and N-type third sense amplifier 120_2, the WPE can be reduced.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor memory device comprising:
    a substrate comprising a first cell array region, a first sense circuit region, a second sense circuit region, and a second cell array region that are formed in order from a first side to a second side;
    first and second bit lines coupled to a plurality of memory cells formed in the first cell array region;
    first and second complementary bit lines coupled to a plurality of memory cells formed in the second cell array region, wherein the first and second complementary bit lines are complementary to the respective first and second bit lines;
    a first column selector formed in the first sense circuit region and coupled to the first bit line and the first complementary bit line; and
    a second column selector formed in the second sense circuit region and coupled to the second bit line and the second complementary bit line,
    wherein:
    the first column selector and the second column selector are formed directly adjacent to each other;
    a first sense amplifier of a first conductivity type, a first equalizer, a second sense amplifier of a second conductivity type, and the first column selector are positioned in the first sense circuit region in order from the first side to the second side; and
    the second column selector, a third sense amplifier of the second conductivity type, a second equalizer, and a fourth sense amplifier of the first conductivity type are positioned in the second sense circuit region in order from the first side to the second side.

2. The semiconductor memory device of claim 1, wherein the first complementary bit line traverses the second sense circuit region and extends to the first sense circuit region, and the second bit line traverses the first sense circuit region and extends to the second sense circuit region.

3. The semiconductor memory device of claim 1, wherein the first conductivity type is P-type and the second conductivity type is N-type.

4. A semiconductor memory device comprising:
    a first bit line and a first complementary bit line formed with an open bit line structure;
    a second bit line and a second complementary bit line formed with an open bit line structure; and
    a first sense amplifier of a first conductivity type, a first equalizer, a second sense amplifier of a second conductivity type, a first column selector, a second column selector, a third sense amplifier of the second conductivity type, a second equalizer, and a fourth sense amplifier of the first conductivity type that are positioned in order from a first side to a second side;
    wherein the first sense amplifier of the first conductivity type, the first equalizer, the second sense amplifier of the second conductivity type, and the first column selector are connected to the first bit line and the first complementary bit line; and
    wherein the second column selector, the third sense amplifier of the second conductivity type, the second equalizer, and the fourth sense amplifier of the first conductivity type are connected to the second bit line and the second complementary bit line.

5. The semiconductor memory device of claim 4, wherein the first conductivity type is P-type and the second conductivity type is N-type.

6. The semiconductor memory device of claim 4, further comprising a first memory cell array connected to the first and second bit lines, and a second memory cell array connected to the first and second complementary bit lines.

7. A semiconductor memory device comprising:
 a substrate comprising a first cell array region, a first sense circuit region, a second sense circuit region, and a second cell array region arranged in order from a first side to a second side;
 first and second bit lines coupled to a plurality of memory cells formed in the first cell array region;
 first and second complementary bit lines coupled to a plurality of memory cells formed in the second cell array region, wherein the first and second complementary bit lines are complementary to the respective first and second bit lines; and
 a P-type first sense amplifier, a first equalizer, an N-type second sense amplifier, and a first column selector that are formed in the first sense circuit region and are coupled to the first bit line and the first complementary bit line, wherein the P-type first sense amplifier and the N-type second sense amplifier are positioned on opposite sides of the first equalizer.

8. The semiconductor memory device of claim 7, further comprising a second column selector coupled to the second bit line and the second complementary bit line, an N-type third sense amplifier, a second equalizer, and a P-type fourth sense amplifier that are formed in the second sense circuit region, wherein the P-type fourth sense amplifier and the N-type third sense amplifier are formed on opposite sides of the second equalizer.

9. The semiconductor memory device of claim 8, wherein:
 the P-type first sense amplifier, the first equalizer, the N-type second sense amplifier, and the first column selector are positioned in the first sense circuit region in order from the first side to the second side; and
 the second column selector, the N-type third sense amplifier, the second equalizer, and the P-type fourth sense amplifier are positioned in the second sense circuit region in order from the first side to the second side.

10. The semiconductor memory device of claim 8, wherein:
 the P-type first sense amplifier, the first equalizer, the first column selector, and the N-type second sense amplifier are positioned in the first sense circuit region in order from the first side to the second side; and
 the second column selector, the N-type third sense amplifier, the second equalizer, and the P-type fourth sense amplifier are positioned in the second sense circuit region in order from the first side to the second side.

11. The semiconductor memory device of claim 8, wherein:
 the first column selector, the N-type second sense amplifier, the first equalizer, and the P-type first sense amplifier are positioned in the first sense circuit region in the order from the first side to the second side; and
 the P-type fourth sense amplifier, the second equalizer, the N-type third sense amplifier, and the second column selector are positioned in the second sense circuit region in order from the first side to the second side.

12. The semiconductor memory device of claim 11, wherein the P-type first sense amplifier and the P-type fourth sense amplifier are formed in the same well.

13. The semiconductor memory device of claim 8, wherein the N-type second sense amplifier, the first column selector, the first equalizer, and the P-type first sense amplifier are positioned in the first sense circuit region in order from the first side to the second side; and
 the P-type fourth sense amplifier, the second equalizer, the second column selector, and the N-type third sense amplifier, are positioned in the second sense circuit region in order from the first side to the second side.

14. The semiconductor memory device of claim 13, wherein the P-type first sense amplifier and the P-type fourth sense amplifier are formed in the same well.

15. The semiconductor memory device of claim 7, wherein the first complementary bit line traverses the second sense circuit region and extends to the first sense circuit region, and the second bit line traverses the first sense circuit region and extends to the second sense circuit region.

* * * * *